United States Patent [19]

Marchand

[11] Patent Number: 5,745,509
[45] Date of Patent: Apr. 28, 1998

[54] TRANSMISSION SYSTEM VIA COMMUNICATIONS PROTECTED BY AN ERROR MANAGEMENT CODE

[75] Inventor: Philippe Marchand, Paris, France

[73] Assignee: U.S. Philips Corporation, New York, N.Y.

[21] Appl. No.: 559,963

[22] Filed: Nov. 17, 1995

[30]   Foreign Application Priority Data

Nov. 30, 1994 [FR]   France ..................... 9414375

[51] Int. Cl.$^6$ ................................. H03M 13/12
[52] U.S. Cl. ........................... 371/43.1; 371/43.5
[58] Field of Search ................. 371/43, 37.1, 38.1, 371/39.1, 37.4, 43.1, 43.5

[56]   References Cited

U.S. PATENT DOCUMENTS

| | | | |
|---|---|---|---|
| 3,685,016 | 8/1972 | Eachus | 340/146 |
| 4,119,945 | 10/1978 | Lewis, Jr. et al. | 371/43 |
| 4,433,415 | 2/1984 | Kojima | 371/37.4 |
| 4,796,260 | 1/1989 | Schilling et al. | 371/39 |
| 4,849,974 | 7/1989 | Schilling et al. | 371/37.4 |
| 5,570,391 | 10/1996 | Lin et al. | 375/265 |

*Primary Examiner*—Stephen M. Baker
*Attorney, Agent, or Firm*—Leroy Eason

[57]   ABSTRACT

A data transmission system wherein data to be transmitted is supplied to an encoding device (5) which comprises a data analysis circuit (35) for producing a parity code and an output circuit (32) for assigning the parity code to the input data so as to convert it into protected data for transmission. The data analysis circuit includes: (i) a serial-to-parallel converter (30) for converting the input data into "n" parallel data streams, the bits in each stream being at instants which are multiples of n×T, where T is the bit period of the input data; (ii) "n" cascade combinations of delay elements, each cascade delaying one of the "n" parallel-converted data streams by time periods which are multiples of n×T, each cascade having tapping points following certain ones of the delay elements therein; and (iii) combining circuits (GR1, GR2, OE) having inputs connected to tapping points of each of the cascade combinations and which derive the parity code.

3 Claims, 3 Drawing Sheets

TRANSMISSION SYSTEM VIA COMMUNICATIONS PROTECTED BY AN ERROR MANAGEMENT CODE

FIELD OF THE INVENTION

The present invention relates to a data transmission system wherein bit strings are protected by an error management code which takes into account, at least twice, the value of each bit. Such system comprises an encoding device which includes a data analysis circuit for producing an error management code on an output, and an output circuit for producing protected data on an output access by assigning said error management code to the input data. The system further comprises a decoding device which has a receiving access for receiving the transmitted protected data, an error processing circuit, and an output access for producing recovered data.

Such a system finds important applications, particularly in the field of data transmission and also in the field of data recording, wherein the recording medium, for example, magnetic tape or compact disc, is then considered a transmitting means.

The present invention also relates to an encoding device and a decoding device suitable for such a system.

BACKGROUND OF THE INVENTION

A means for error protection of transmitted information streams is described in U.S. Pat. No. 4,796,260. Therein an error correction code is described which applies to blocks of bits. However, that is a disadvantage when one wishes to process the data at a high rate, as a block cannot be processed until the entire block has been received.

SUMMARY OF THE INVENTION

The present invention provides a system of the aforesaid type in which the processing is performed continuously an successive string of bits.

Therefore, such a system is characterized in that the data analysis circuit comprises:

serial-to-parallel converting means, which have an input for receiving data and "n" outputs for producing the data at instants which are multiples of n×T, where T is the bit period;

"n" cascade combinations of delay elements for delaying the parallel-converted data by time periods which are multiples of n×T, which cascade combinations have tapping points at each of the delay elements; and combining circuits which have inputs connected to at least two tapping points of all the cascade combinations to produce said error management code.

These and other aspects of the invention will be apparent from and elucidated with reference to the embodiments described hereinafter.

DESCRIPTION OF PREFERRED EMBODIMENTS

Figure 1:
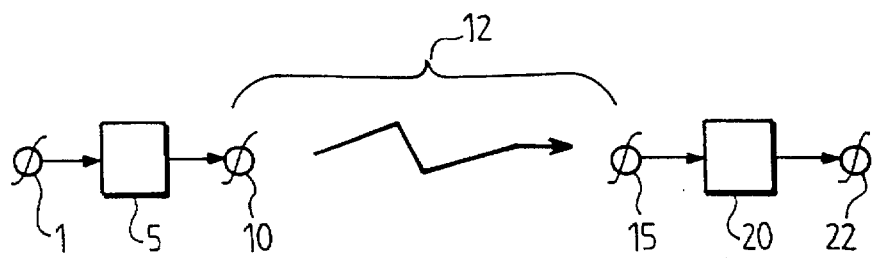
FIG. 1 shows a transmission system according to the invention.

In FIG. 1, which shows a transmission system according to the invention, reference 1 indicates an input access for a bit string. This string is processed by an encoding device 5 to produce, on an output access 10, another bit string in which are inserted bits of an error management code. This string forms the protected data. A transmission means 12 (not shown because it is unimportant for the measures of the invention), transmits these protected data to the receiving access 15 of a decoding device 20 which produces the recovered data on an output access 22.

Within the framework of the described example, the error management code is a simple parity code. Each bit of the bit string will at least twice be involved in a parity calculation, so that it becomes possible to correct some transmission errors.

Figure 2:
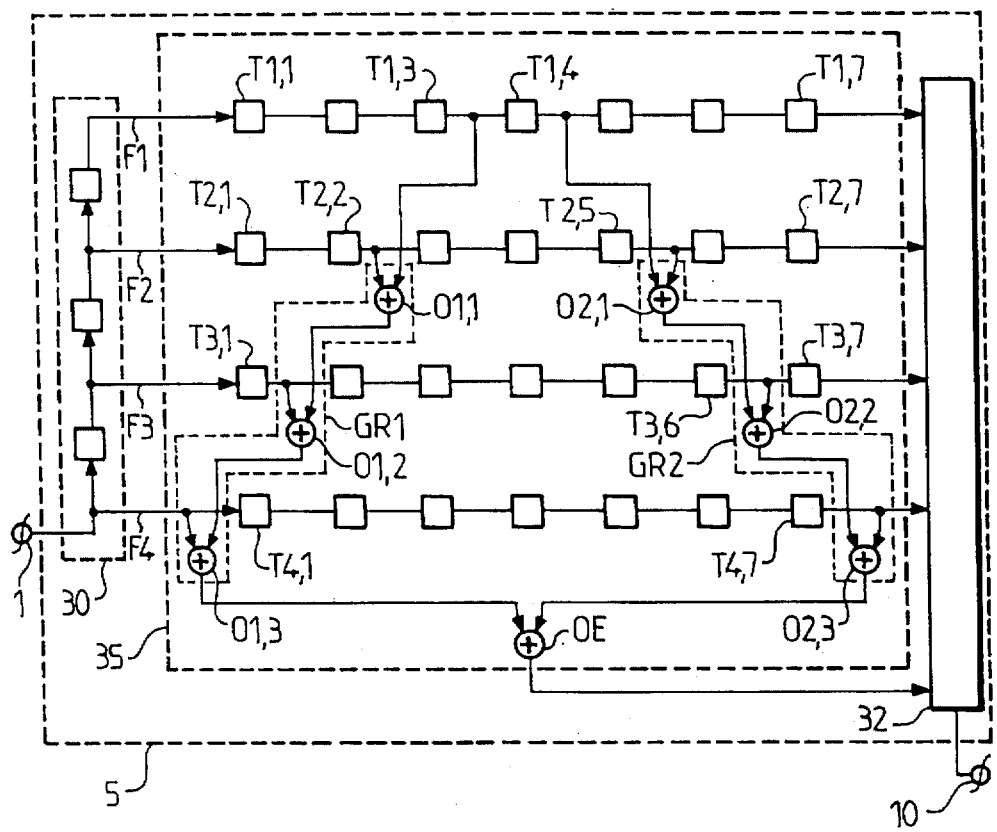
FIG. 2 shows an encoding device according to the invention.

FIG. 2 shows an embodiment for an encoding device according to the invention. It comprises first of all a serial-to-parallel converting circuit 30 which converts the series of bits received on access 1, which have a frequency equal to 1/T, into "n" bit strings. To simplify the explanation, the number "n" has been taken equal to "4". These four strings are rendered available on wires F1, F2, F3 and F4 branching off from the outputs of circuit 30. Each of these wires is connected to an input of an output circuit 32 via a data analysis circuit 35. The data analysis circuit 35 is formed by four cascade combinations of delay elements connected each to the first of the wires F1 to F4: one cascade combination comprises the delay elements T1,1 to T1,7 and is connected to wire F1, the second combination is of elements T2,1 to T2,7 and is connected to wire F2, the third cascade combination is of elements T3,1 to T3,7 and is connected to wire F3, and the fourth cascade combination is of elements T4,1 to T4,7 and is connected to wire F4. Each of these delay elements causes a delay equal to n×T. The output circuit 32 transforms the signals on its inputs so as to produce them on the output access 10 by appropriately processing them to adapt them to the transmission medium 12.

To perform the parity calculation in accordance with the invention, the analysis circuit 35 comprises combining circuits. They are formed by two groups of "EXCLUSIVE-OR" operators GR1 and GR2 and an "EXCLUSIVE-OR" gate OE. The first group GR1 is formed by three EXCLUSIVE-OR gates O1,1 O1,2 and O1,3. The inputs of gate O1,1 are connected to the output of delay element T1,3 and that of delay element T2,2, which in practice represents the middle of the cascade combination; the inputs of gate O1,2 are connected to the output of gate O1,1 and that of delay element T3,1, and the inputs of gate O1,3 are connected to the output of gate O1,2 and the input of element T4,1. The second group is formed by three "EXCLUSIVE-OR" gates O2,1, O2,2 and O2,3. The inputs of gate O2,1 are connected to the output of delay element T1,4 and that of T2,5, the inputs of gate O2,2 to the output of gate O2,1 and that of element T3,6 and the inputs of gate O2,3 to the output of gate O2,2 and that of element T4,7. The gate OE produces the combined parity according to the invention. Therefore, its inputs are connected to the output of the gate O1,3 and that of gate O2,3. The output circuit 32 also provides the transmission of this parity information.

Thus for each successive cascade combination, the gate input connections are shifted one delay element forward and one delay element back.

Figure 3:
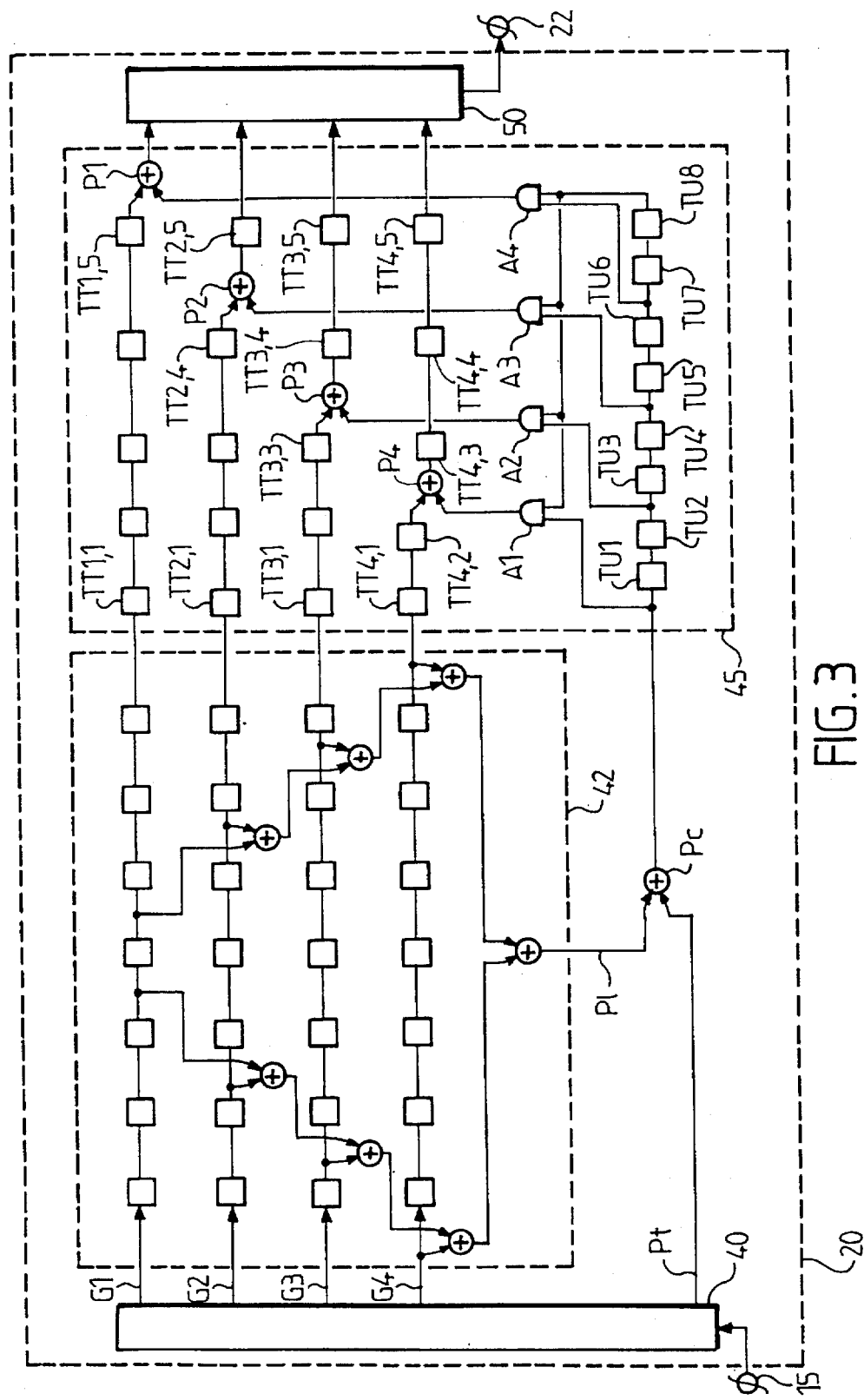
FIG. 3 shows a decoding device according to the invention.

FIG. 3 shows an embodiment of a decoding device according to the invention. It is formed first of all by a distributing circuit 40 for distributing the transmitted data received at access 15. This circuit produces on wires G1 to G4 the transmitted information streams and on a wire Pt the transmitted parity code processed by the analysis circuit 35 of the encoding device 5. A second analysis circuit 42, which has the same structure as the circuit 35, produces a local parity P1 which is compared with the transmitted parity Pt and relates to the same bits. The result of this comparison is applied to an error correction circuit 45 which then corrects the errors in the bits coming from the wires G1 to G4. An output circuit 50 then produces on the access 22 the information streams for the user.

The error correction circuit 45 is formed by four cascade combinations of delay elements which combinations comprise each the following delay elements: TT1,1 to TT1,5 for the first combination, TT2,1 to TT2,5 for the second combination, TT3,1 to TT3,5 for the third combination and TT4,1 to TT4,5 for the fourth combination. Various EXCLUSIVE-OR gates P1 to P4 are inserted into the cascade combinations to change the value of the bits. Therefore, gate P1 has one of its inputs connected to the output of element TT1,5 and its output is connected to circuit 50, gate P2 has one of its inputs connected to the output of element TT2,4 and its output to the input of element TT2,5, gate P3 has one of its inputs connected to the output of element TT3,3 and its output to the input of element TT3,4 and gate P4 has one of its inputs connected to the output of element TT4,2 and its output to the input of element TT4,3. The other inputs of gates P1 to P4 are connected to the outputs of the AND gates A4 to A1, respectively. One input of all these gates is connected to the output of a delay element TU8 which is the last of a series combination of delay elements TU1 to TU8 connected to the output of an EXCLUSIVE-OR gate Pc which compares parities on the output P1 with the parity Pt produced in circuit 35.

Thus, the gates A1 to A4 produce a "1" on their output when two faulty parity codes are applied to their input; it is thus possible to correct the bit that has generated these two faulty parities.

THEORETICAL CONSIDERATIONS ON THE INVENTION

Figure 4:
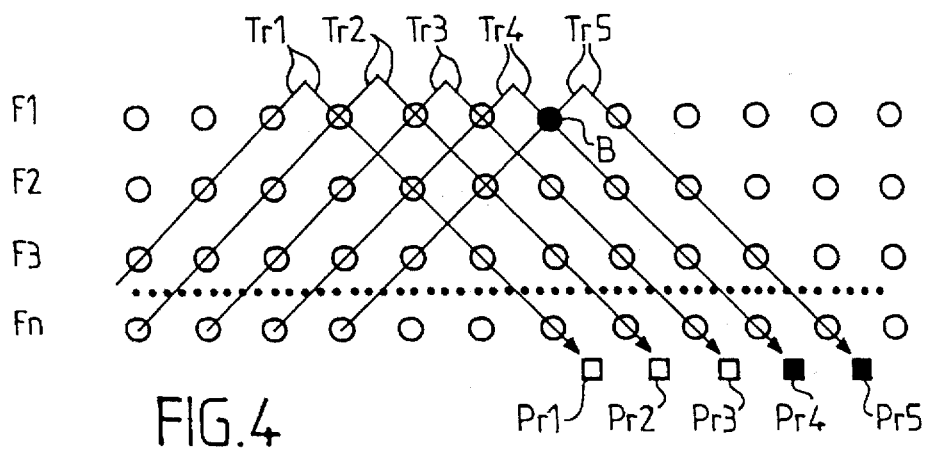
FIG. 4 shows a diagram intended for the explanation of the invention.

The data to be encoded, which are supposed to be available in serial form are converted to parallel form in n strings available on the wires F1 to Fn, which is shown in FIG. 4, in which the bits of the n parallel strings are shown by small circles. Thereafter, a simple parity calculation is made of the words of 2n bits defined in the paths Tr1 to Tr5 shown. The parity bits Pr1 to Pr5 obtained are symbolized by small squares.

An arbitrary bit of the data is always at the intersection of two "paths", and of two paths only. This means that in the case of erroneous transmission of an information bit, there will be a divergence called parity (obtained when the transmitted redundancy bits are compared with those which will be recalculated on reception according to the same principle), of two parity bits (redundancy). The "paths" associated with these two parity bits, which paths are known in principle, make it possible to localize the faulty data bit at their intersection and to make the correction by inverting its value. This is the case, for example, for the parity bits Pr4 and Pr5 which are represented in black squares and do not correspond to those that have been transmitted (after calculation on reception). The result will be that the bit "B" located at the intersection of 2 paths Tr4 and Tr5 connected to Pr4 and Pr5 has been subject to a transmission error.

CODE PROPERTIES a This code strongly looks like the block codes, although it is not possible to actually define the block (the blocks are interleaved).

b The limit of the code is reached when 2 bits belonging to a same "path" are faulty. This makes it possible to estimate the approximate value of the effectiveness of the correction.

If the data are divided into "n" strings, the redundancy is 1 bit for n data bits (overhead of n+1/n−1)100 in %).

When there is a transmission error ratio of P (bit error probability before correction), the probability of having 2 faulty bits belonging to one and the same path is about $2nP^2$ (with low P).

Compared with the Hamming code for which m redundancy bits are added to blocks of $2^m-1$ information bits and for which the correction limit corresponds to about $2^m P^2$ (for large m), a same error ratio after correction is supposed for the two codes:

Hamming: $2^m P^2 \to$ redundancy $\approx 100\ m/2^m$ in % interleaved parity: $2nP^2 \to$ redundancy $\approx 100/n$ in % if $2^m P^2 = 2nP^2 \to n = 2^{m-1}$:

redundancy of the Hamming code: $100\ m/2^m = R_H$ redundancy of the interleaved parity code: $100/2^{m-1} = R_p$ $R_H/R_p = m/2$.

In general, the parameter m for a Hamming code is selected large enough ($m \geq 5$) and the equation $R_H/R_p = m/2$ shows that the redundancy of an interleaved parity code as proposed is clearly lower with an equivalent correction effectiveness. Conversely, with equivalent redundancy:

$$100\ m/2^m = 100/n \to n = 2^m/m$$

the error ratios after correction are respectively:

$P_H = 2^m P^2$ (Hamming)

$P_p = 2nP^2 = 2^{m+1}/m\ P^2$ (interleaved parity)

$P_H/P_p = m/2 \to$

Thus, there may be deduced herefrom that with equivalent redundancies the error ratio after correction by a Hamming code is m/2 times higher than for an interleaved parity code.

VARIANT

Figure 5:
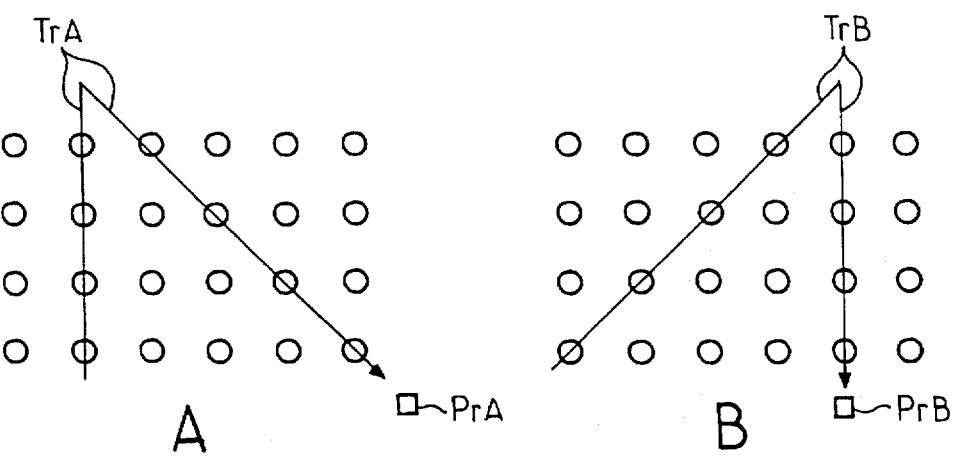
FIG. 5 shows a diagram for the explanation of other variants of the invention.

There exists another class of paths which have identical properties: see FIG. 5A and 5B, which show two types of paths TrA and TrB which make it possible to obtain two parity bits PrA and PrB. These paths need a small memory.

OBSERVATION

Figure 6:
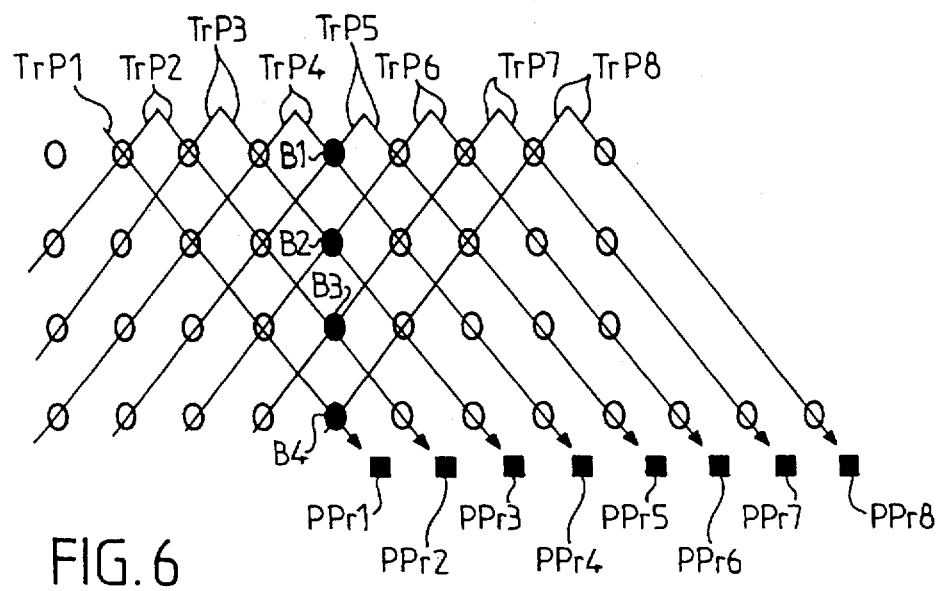
FIG. 6 shows an explanatory diagram for showing advantages of the invention for the packet error correction.

There is shown in FIG. 6 that the paths of the type shown in FIG. 4 are favourable for the correction of error "packets". Thus, divergencies of parity PPr1 to PPr8 relating to paths TrP1 to TrP8 make it possible to correct the packet $B_1$ to $B_4$ of successive erroneous bits. Without complex computation, this property is not satisfactory for a block code. It will become more effective as n is greater.

I claim:

1. A transmission system for successive bit strings of data and which provides error protection by applying an error management code which takes into account, at least twice, the value of each bit; said system comprising:

an encoding device which has an input access for input data to be transmitted, the input data having a bit frequency equal to 1/T, serial-to-parallel converting means for receiving the input data from the input access and having a plurality "n" of outputs at which parallel-converted input data is produced at instants which are multiples of n×T, a data analysis circuit for receiving parallel-converted data from said converting means and producing an error management code therefrom, and an output circuit for producing protected data at an output access thereof by assigning said error management code to the parallel-converted input data;

means for transmitting the protected data; and a decoding device which has a receiving access for receiving the transmitted protected data, an error processing circuit, and an output access at which data recovered from the received data is produced;

wherein said data analysis circuit comprises a plurality "n" of cascade combinations of delay elements, each cascade delaying a string of parallel-converted data received from such converting means for time periods which are multiples of n×T, and a plurality of combining circuits having inputs connected to at least two tapping points of each of said cascade combinations and which combine data bits present at said tapping points to thereby derive said error management code;

each of said cascade combinations of said data analysis circuit having tapping points following two delay elements therein which are equal to, respectively, (p−j+1)×(n×T) and (p+j)×(n×T), where j=1 . . . n, and p represents the average total number of delay elements in each of said cascade combinations.

2. A transmission system for successive bit streams of data and which provides error protection by applying an error management code which takes into account, at least twice, the value of each bit, said system comprising:

an encoding device which has an input access for input data to be transmitted, the input data having a bit frequency equal to 1/T, serial-to-parallel converting means for receiving the input data from the input access and having a plurality "n" of outputs at which parallel-converted input data is produced at instants which are multiples of n×T, a first data analysis circuit for receiving parallel-converted data from said converting means and producing an error management code therefrom, and an output circuit for producing protected data at an output access thereof by assigning said error management code to the parallel-converted input data;

means for transmitting the protected data; and a decoding device which has a receiving access for receiving the transmitted protected data;

an error processing circuit, and an output access at which decoded data recovered from the received data is produced;

wherein said decoding means comprises:

a distributing circuit for the received data and which separates the transmitted error management code therefrom, a second data analysis circuit having a plurality "n" of cascade combinations of delay elements to which the received data is distributed by said distributing circuit, and which derives from the data so distributed a local error management code, a comparing element ($P_c$) for deriving a comparison signal based on comparison of the transmitted error management code with the local error management code, and a correction circuit for correcting the received data as a function of said comparison signal in order to derive decoded data from the received data;

each of the cascade combinations of said second data analysis circuit having tapping points following the two delay elements therein which are equal to, respectively, (p−j+1)×(n×T) and (p+j)×(n×T), where j=1 . . . n, and p represents the average total number of delay elements in each of said cascade combinations.

3. A transmission system for successive bit streams of data and which provides error protection by applying an error management code which takes into account, at least twice, the value of each bit, said system comprising:

an encoding device which has an input access for input data to be transmitted, the input data having a bit frequency equal to 1/T, serial-to-parallel converting means for receiving the input data from the input access and having a plurality "n" of outputs at which parallel-converted input data is produced at instants which are multiples of n×T, a first data analysis circuit for receiving parallel-converted data from said converting means and producing an error management code therefrom, and an output circuit for producing protected data at an output access thereof by assigning said error management code to the parallel-converted input data;

means for transmitting the protected data; and a decoding device which has a receiving access for receiving the transmitted protected data;

an error processing circuit, and an output access at which decoded data recovered from the received data is produced;

wherein said decoding means comprises:

a distributing circuit for the received data and which separates the transmitted error management code therefrom, a second data analysis circuit having a plurality "n" of cascade combinations of delay elements to which the received data is distributed by said distributing circuit, and which derives from the data so distributed a local error management code, a comparing element ($P_c$) for deriving a comparison signal based on comparison of the transmitted error management code with the local error management code, and a correction circuit for correcting the received data as a function of said comparison signal in order to derive decoded data from the received data;

a correction circuit for correcting the received data as a function of said comparison signal, said correction circuit having a plurality "n" of cascade combinations of delay elements for data received from said second data analysis circuit and delaying the received data for time periods which are multiples of n×T, each of said cascade combinations including data value changers for changing the values of data therein in accordance with said comparison signal; the data value changers having inputs in said cascade combinations following the delay elements therein equal to (q+1−j)×(n×T), where j=1, . . . n, and q represents the average total number of delay elements in each of said cascade combinations.

* * * * *